United States Patent
Tang (10) Patent No.: US 7,265,980 B2
(45) Date of Patent: Sep. 4, 2007

(54) FRAME OF A HEAT SINK FOR A CPU IN A COMPUTER

(75) Inventor: Yanjun Tang, Shenzhen (CN)

(73) Assignee: Asia Vital Component Co., Ltd., Kaohsiung (TW)

( * ) Notice: Subject to any disclaimer, the term of this patent is extended or adjusted under 35 U.S.C. 154(b) by 161 days.

(21) Appl. No.: 11/193,119

(22) Filed: Aug. 1, 2005

(65) Prior Publication Data

US 2007/0025084 A1 Feb. 1, 2007

(51) Int. Cl.
*H05K 7/20* (2006.01)

(52) U.S. Cl. .................... 361/704; 257/718; 257/719; 24/457; 248/505; 248/510; 361/710

(58) Field of Classification Search ........ 257/718–719; 361/719

See application file for complete search history.

(56) References Cited

U.S. PATENT DOCUMENTS 6,570,763 B1 *   5/2003  McHugh et al. ............ 361/704
6,574,109 B1 *   6/2003  McHugh et al. ............ 361/719
6,707,674 B1 *   3/2004  Bryant et al. ............... 361/704
6,757,965 B2 *   7/2004  Colbert et al. ................ 29/836
6,791,847 B2 *   9/2004  Ma ............................ 361/816
7,133,288 B2 *  11/2006  DelPrete et al. ............ 361/719
2003/0231479 A1 * 12/2003 Ma ............................ 361/816

\* cited by examiner

*Primary Examiner*—Greg Thompson (57) ABSTRACT

A frame of a heat sink for a CPU in a computer includes a quadrilateral frame member and four stop plates. One of two opposite sides of the quadrilateral frame member has an opening block step with a length being equal to the width of the heat sink and the bottom of the block step is the same elevation as the top of the second side. The distance between two of the stop plates, which are disposed at both ends of the first side, is equal to the length of the first side. A reinforcing rib is disposed between another two of the stop plates, which are disposed at both ends of the second side, and is parallel to the second side with an elevation higher than the top of the second side and a distance between the inner surface of the reinforcing rib and the block step is equal to the depth of the heat sink for increasing strength and rigidity of the frame against deformation and preventing the heat sink from swaying.

5 Claims, 13 Drawing Sheets

FRAME OF A HEAT SINK FOR A CPU IN A COMPUTER

BACKGROUND OF THE INVENTION

1. Field of the Invention

The present invention is related to a frame of a heat sink and particularly to a frame of a heat sink for a CPU (central processing unit) in a computer.

2. Brief Description of the Related Art

Figure 1:
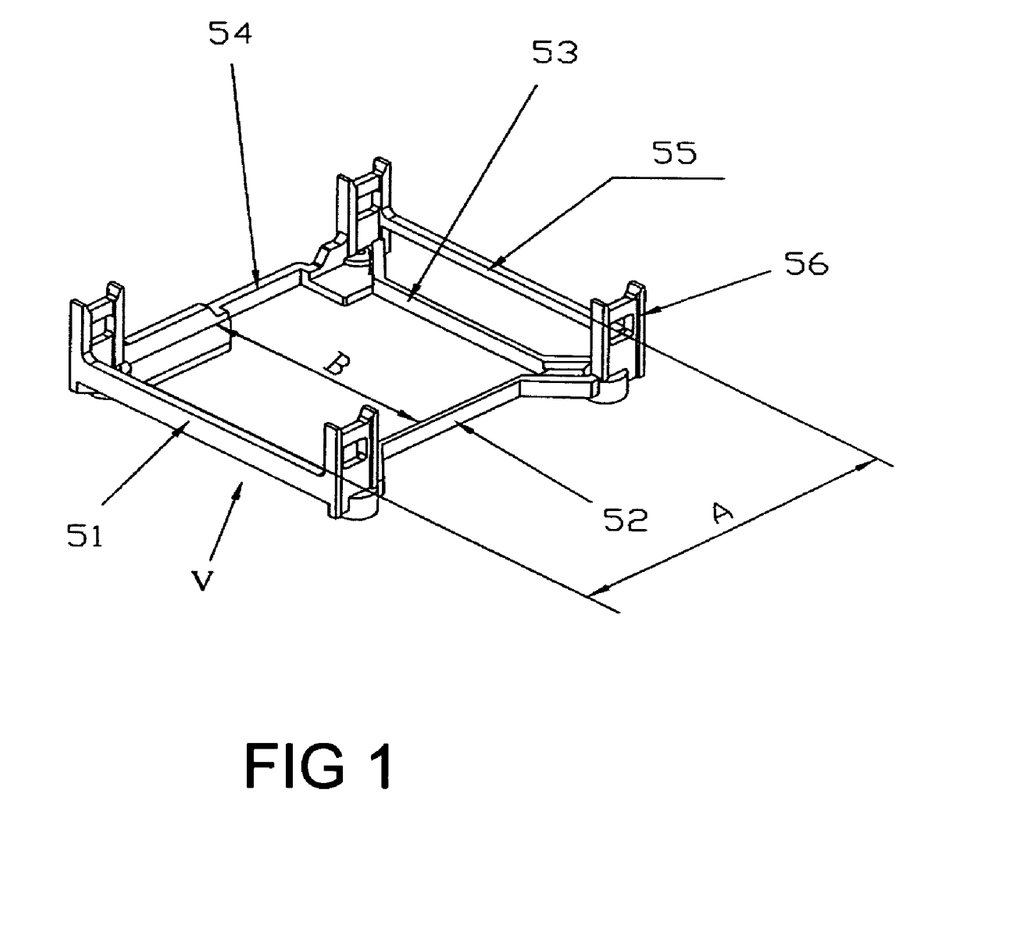
FIG. 1 is a perspective view of the first embodiment of a frame of a heat sink for a CPU in a computer according to the present invention.
Figure 2:
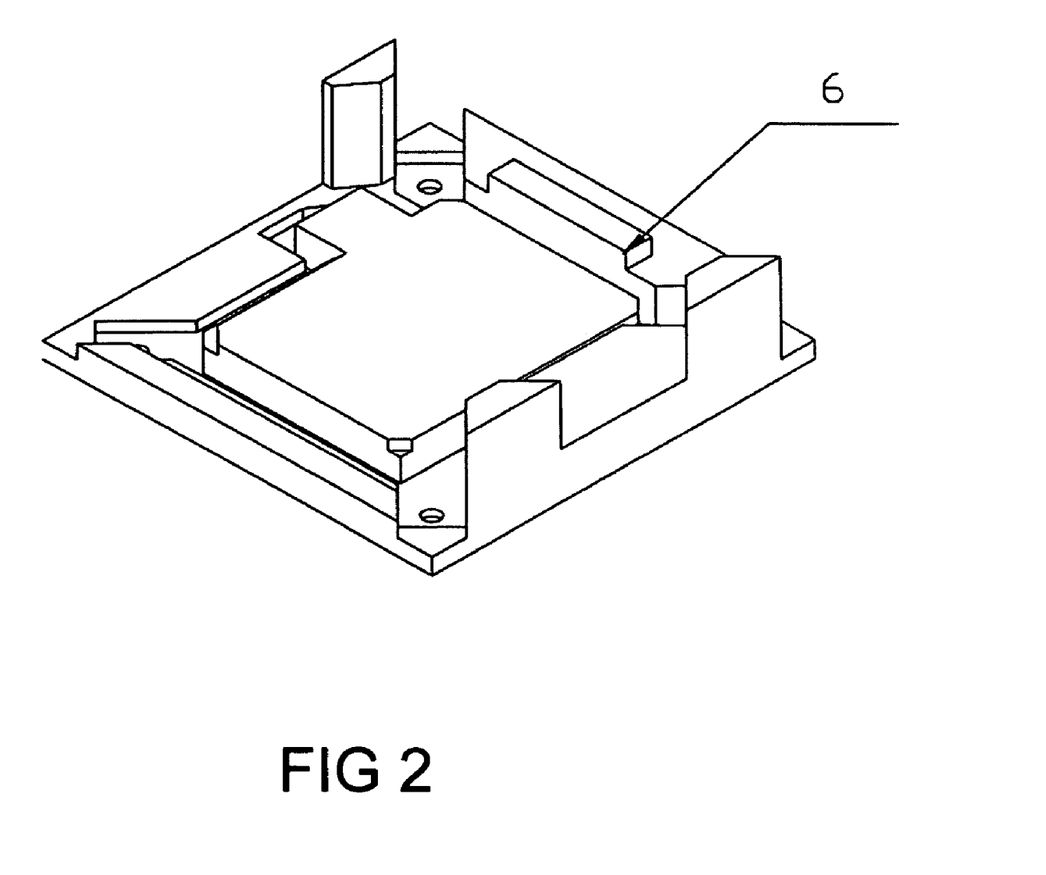
FIG. 2 is a perspective view of a CPU in a computer.
Figure 3:
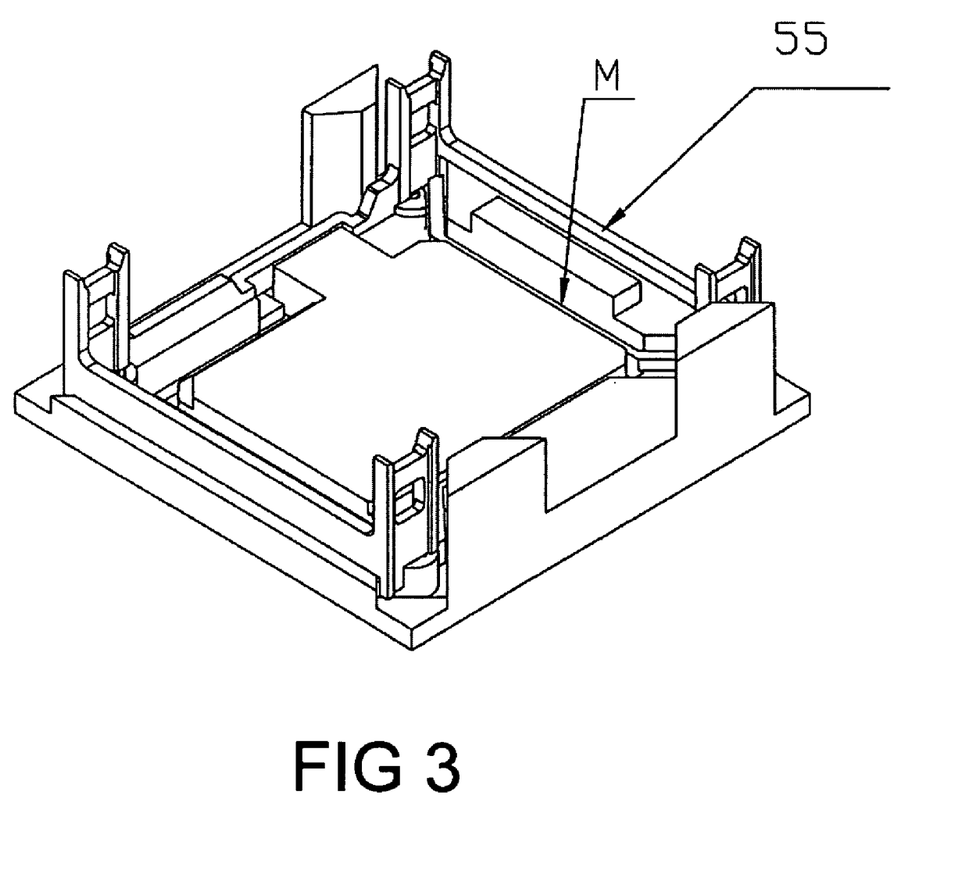
FIG. 3 is a perspective view illustrating the frame shown in FIG. 1 being attached to the CPU shown in FIG. 2.
Figure 4A:
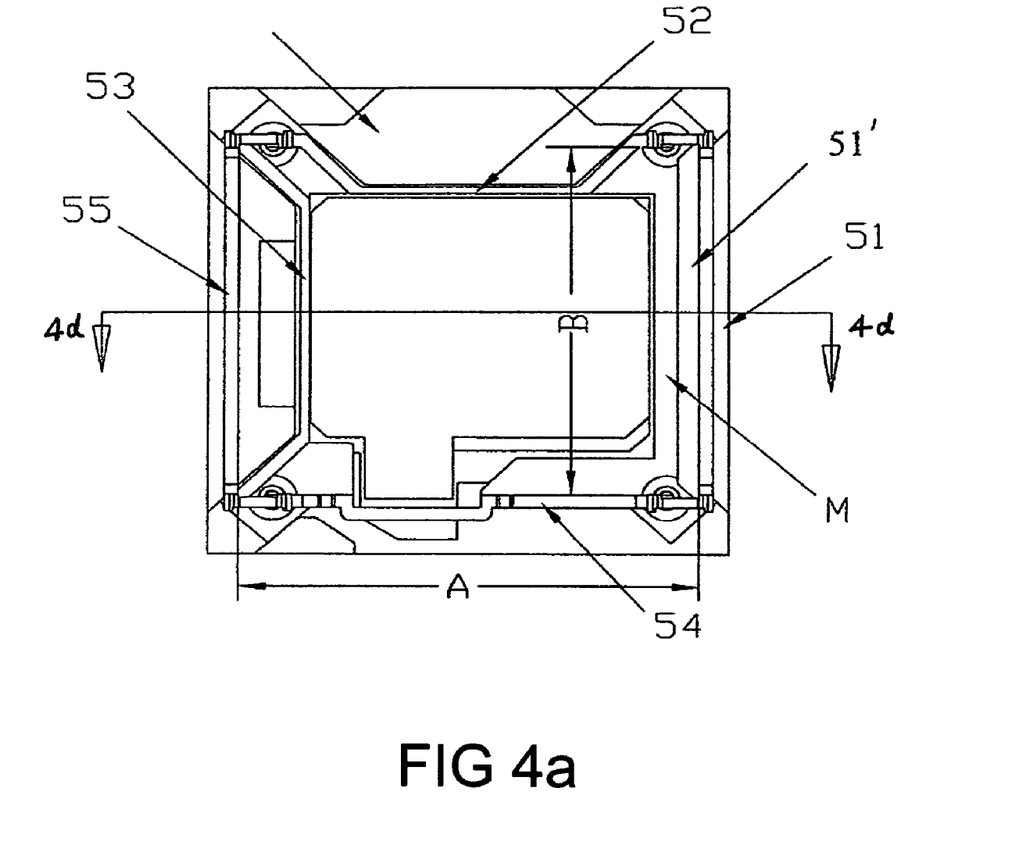
FIG. 4a is a plan view projecting from top of FIG. 3.
Figure 4B:
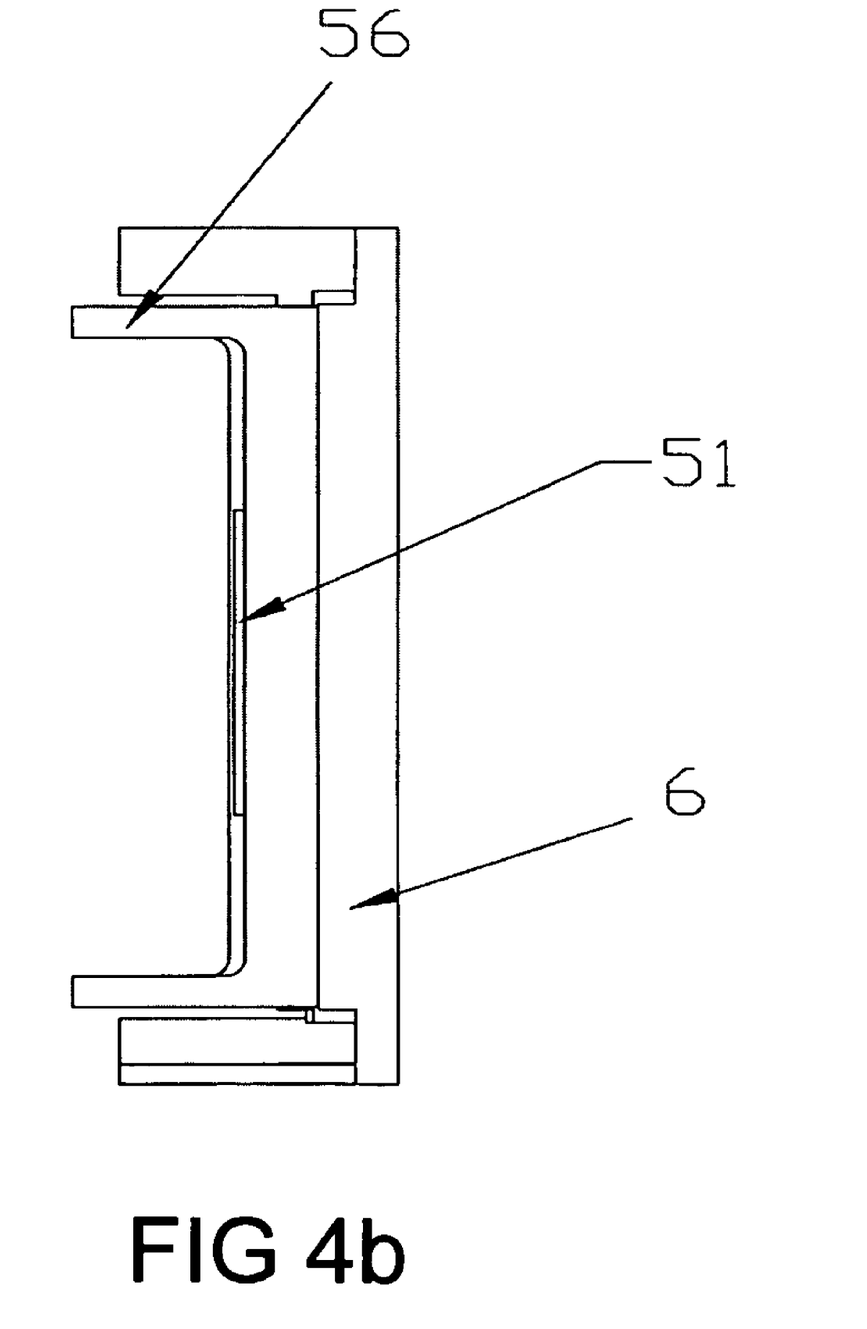
Figure 4C:
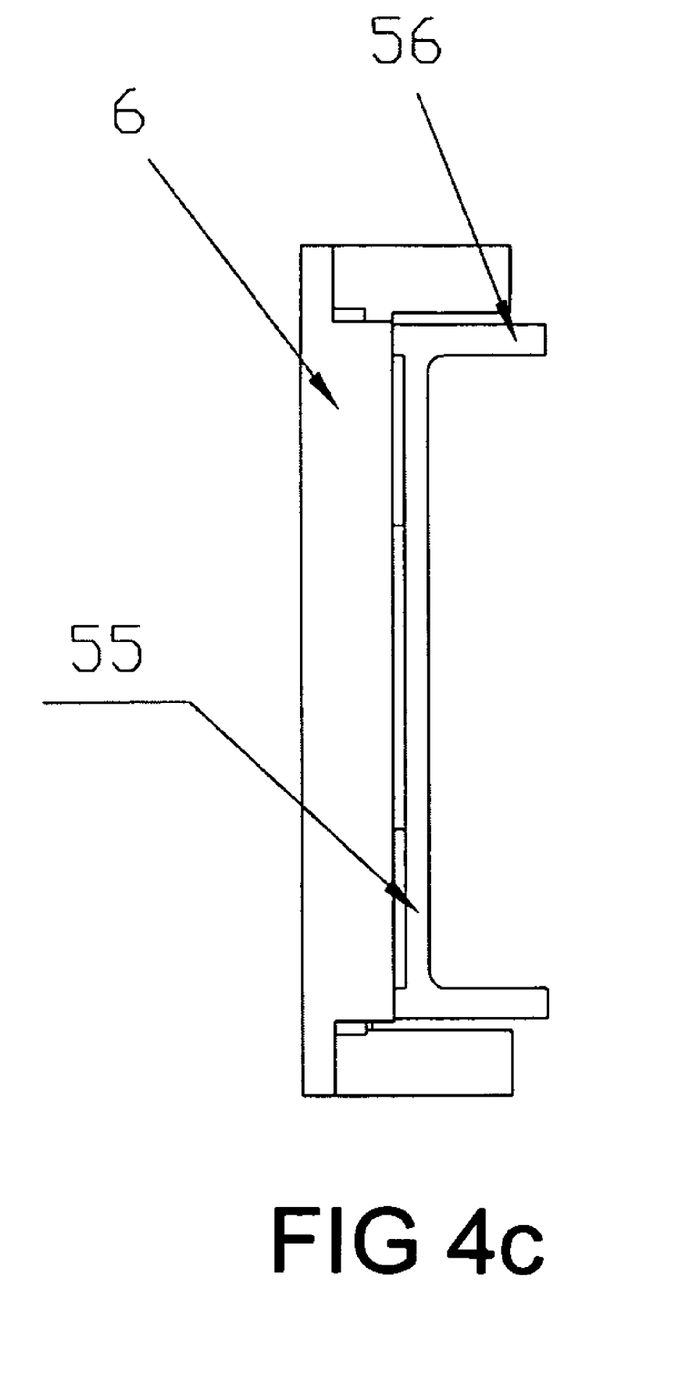
Figure 4D:
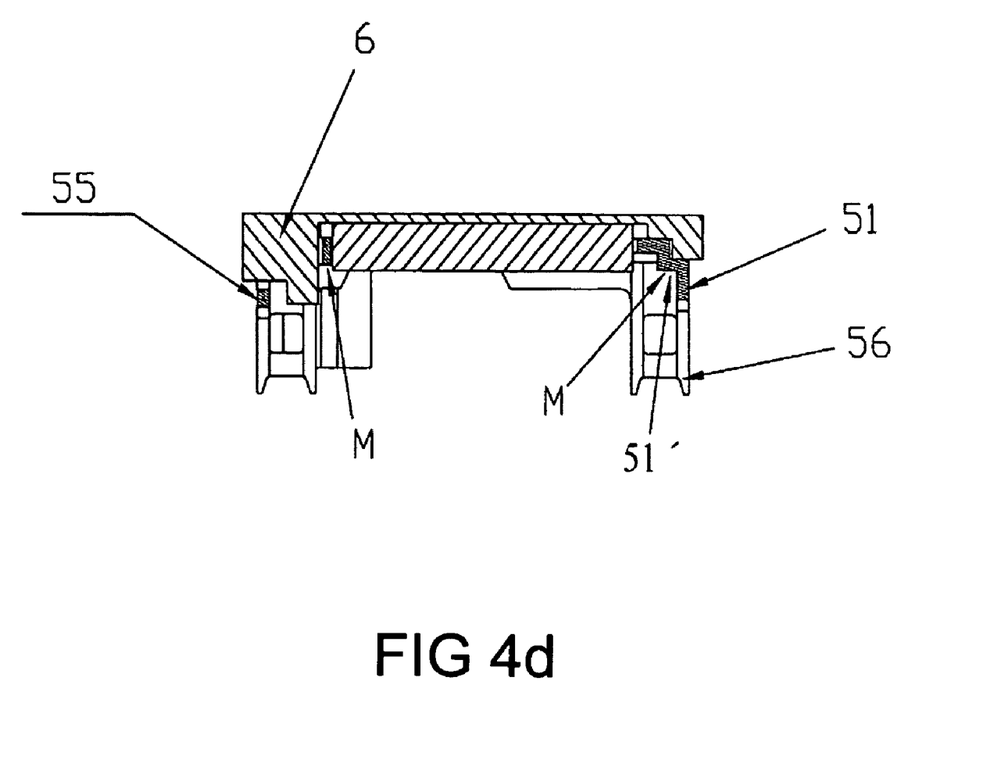
Figure 4E:
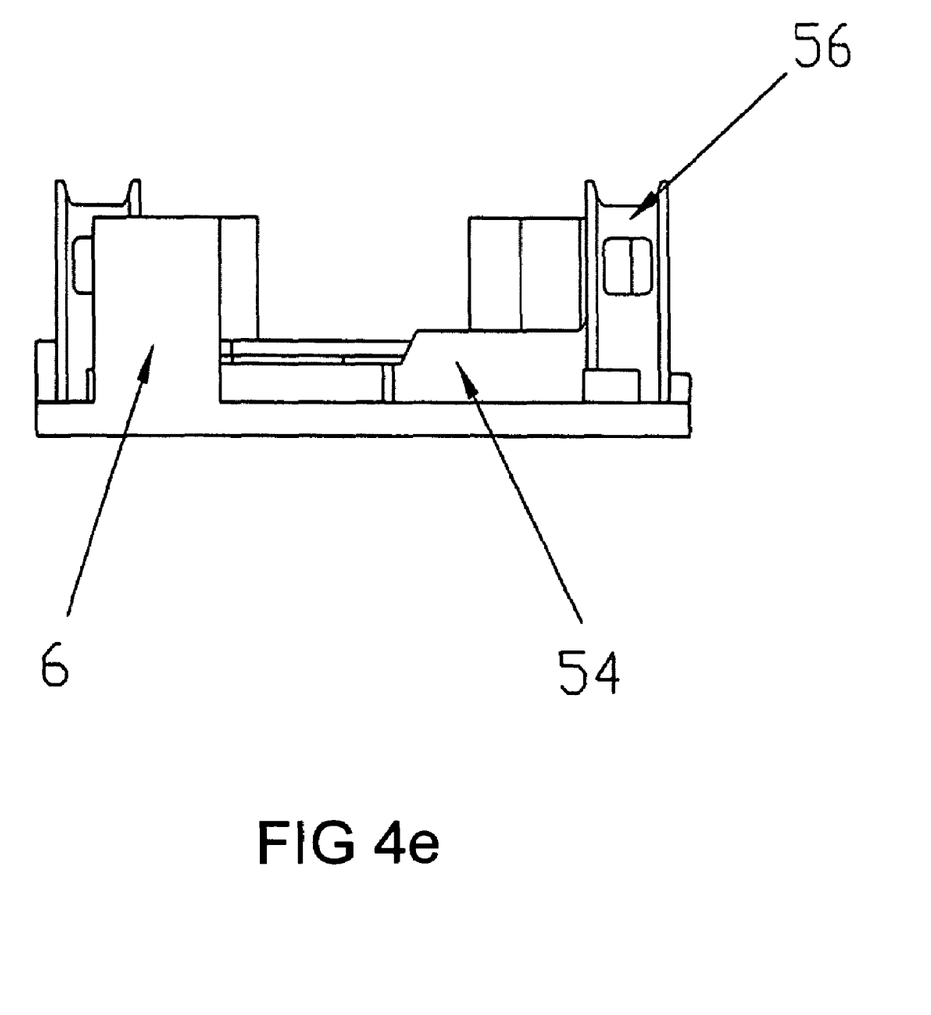
Figure 5:
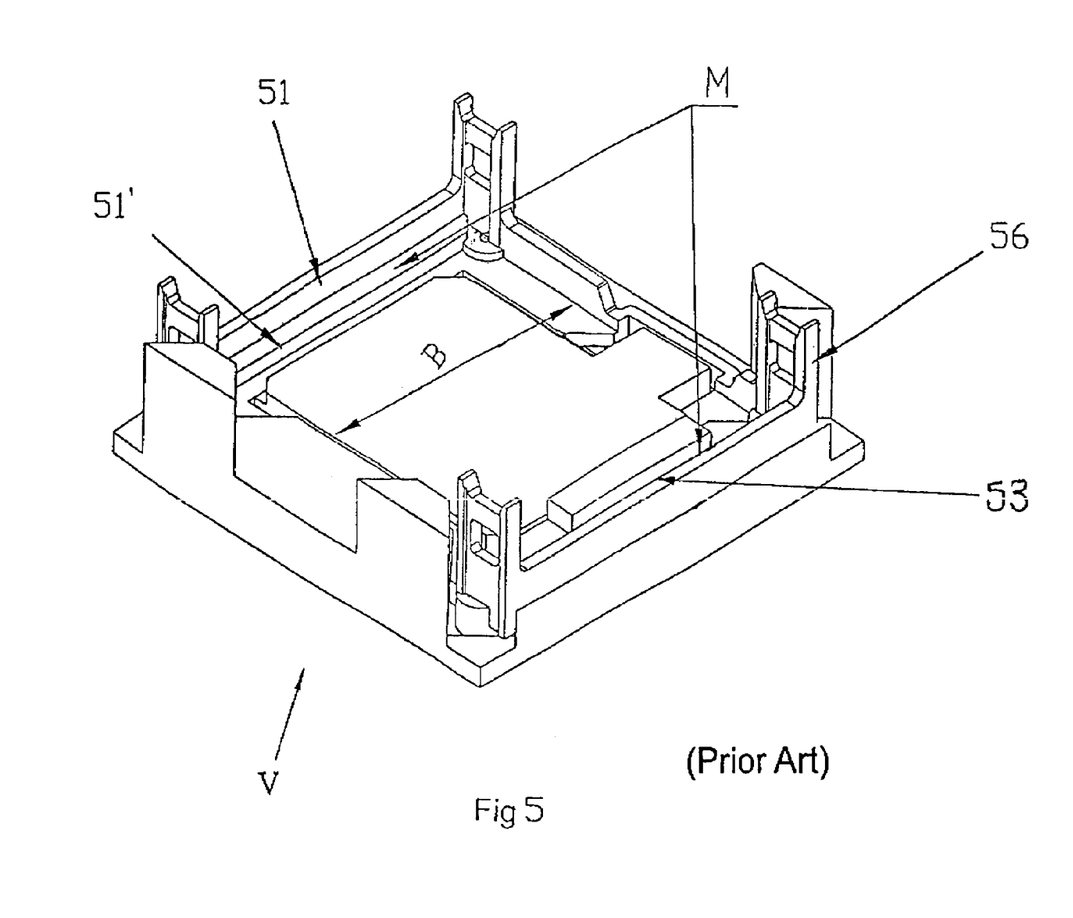
FIG. 5 is a perspective view of the conventional frame being attached to the CPU.

Referring FIG. 5, the currently used frame of a heat sink for a CPU in a computer includes a quadrilateral shaped frame V and an upright stop plate 56 disposed at each corner of the fame V. The respective stop plate 56 is positioned in parallel to each other. The frame V further includes a side 51 with an opening block step 51' extending along the entire length of the side 51 and the side 51 perpendicular to the respective stop plate 56 with the length B thereof being equal to the distance between the inner surfaces between two stop plates 56 at both ends of the side 51. The bottom of the opening block step 51' and the top of another side 53 opposite to the side 51 are at the same plane M. Although the preceding frame basically satisfies the requirement of joining the CPU and the heat sink, there are deficiencies needed to overcome. 1. the frame has restricted the heat sink to move along the direction of the width b thereof by means of the stop plates 56 but the heat sink is still able to move along the direction of depth thereof such that the heat sink becomes swaying easily. 2. The opposite side 53 to the side 51 is thinner and it is easy to be deformed such that it results in the heat sink to sway more easily and even to cause the computer running unstably.

SUMMARY OF THE INVENTION

In order to solve the preceding problems, an object of the present invention is to provide a frame of a heat sink for a CPU in a computer with which strength and rigidity of the frame is increased against deformation and it prevents the heat sink from swaying.

Accordingly, a frame of a heat sink for a CPU in a computer according to the present invention includes a quadrilateral frame member and four stop plates. One of two opposite sides of the quadrilateral frame member has an opening block step with a length being equal to the width of the heat sink and the bottom of the block step is the same elevation as the top of the second side. The distance between two of the stop plates, which are disposed at both ends of the first side, is equal to the length of the first side. A reinforcing rib is disposed between another two of the stop plates, which are disposed at both ends of the second side, and is parallel to the second side with an elevation higher than the top of the second side and a distance between the inner surface of the reinforcing rib and the block step is equal to the depth of the heat sink.

BRIEF DESCRIPTION OF THE DRAWINGS

The detail structure, the applied principle, the function and the effectiveness of the present invention can be more fully understood with reference to the following description and accompanying drawings, in which:

FIG. 4b is a right side elevation view of FIG. 4a;

FIG. 4c is a left side elevation view of FIG. 4a;

FIG. 4d is a sectional view along line 4d-4d in FIG. 4a;

FIG. 4e is a bottom view of FIG. 4a;

DETAILED DESCRIPTION OF THE INVENTION

Referring to FIGS. 1 to 3, 4a to 4d and FIG. 6, the first embodiment of a frame of a heat sink for a CPU in a computer according to the present invention includes a quadrilateral shaped frame V and an upright stop plate 56 disposed at each corner of the fame V. The respective stop plate 56 is positioned in parallel to each other. The frame V further includes a side 51 with an opening block step 51' extending along the entire length of the side 51 and the side 51 perpendicular to the respective stop plate 56 with the length B thereof being equal to the distance between the inner surfaces between two stop plates 56 at both ends of the side 51. The bottom of the opening block step 51' and the top of another side 53 opposite to the side 51 are at the same plane M. Besides, a reinforcing rib 55 is disposed between inner surfaces of two stop plates 56 at both ends of the side 53 and the reinforcing rib 55 is parallel to the side 53 and has a higher elevation than the top of the side 53. Further, a distance A between the inner surface of the reinforcing rib 55 and the stop plate 56 for mounting the heat sink is equal to the depth a of the heat sink.

Referring to FIG. 5 again, it can be seen the conventional frame has restricts the heat sink to move along the direction of the width b thereof by means of the stop plates 56 but the heat sink is able to move along the direction of depth a thereof. It can be seen from FIGS. 1, 3 and 4a to 4e, the reinforcing rib 55 is provided between inner surfaces of two stop plates 56 at both ends of the side 53 and has a higher elevation than the top of the side 53 and a distance A between the inner surface of the reinforcing rib 55 and the stop plate 56 for mounting the heat sink is equal to the depth a of the heat sink. Hence, the heat sink is unable to move along the direction of depth a thereof. Meanwhile, the reinforcing rib 55 has joined the stop plates 56 at the both ends of the side 53 such that the strength and rigidity of the side 53 increase largely. The height difference between the reinforcing rib 55 and the side 53 is decided based on substantial size of the heat sink.

Figure 6:
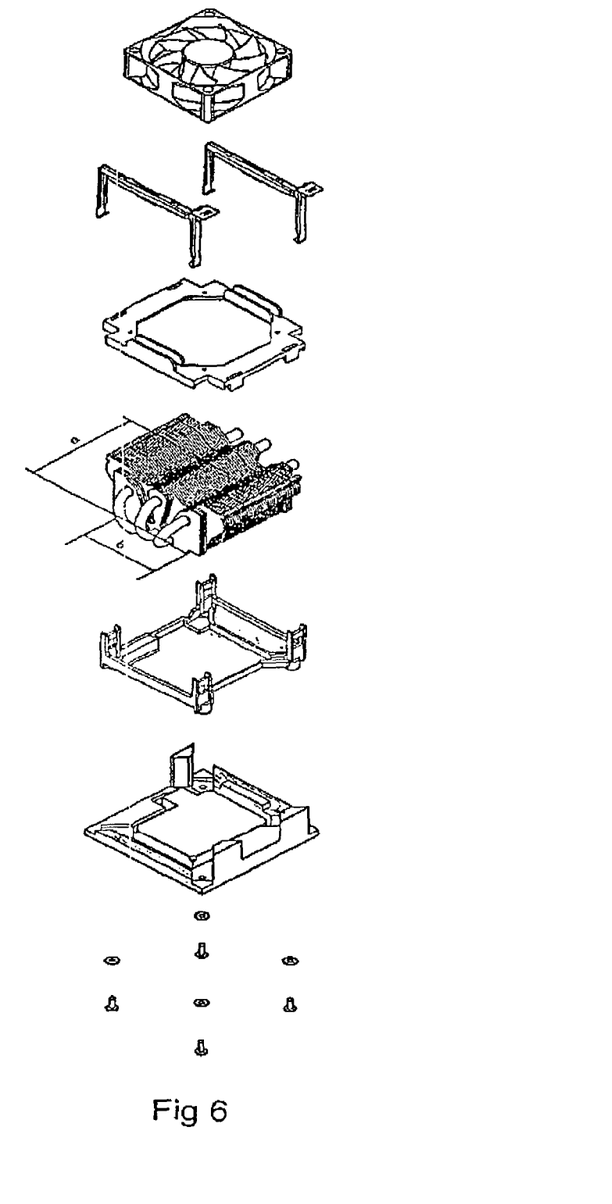
FIG. 6 is a disassembled perspective view of the frame and the heat sink device before being attached to the CPU.

Referring to FIG. 6, the heat sink in the first embodiment of the present invention is associated with other related parts. It can be seen parts from top to the bottom of the figure are a fan 1, a lock tool 2, a fan casing 3, a heat sink 4, a frame 5, a CPU 6, fastening screws 8 and washers 7.

Figure 7:
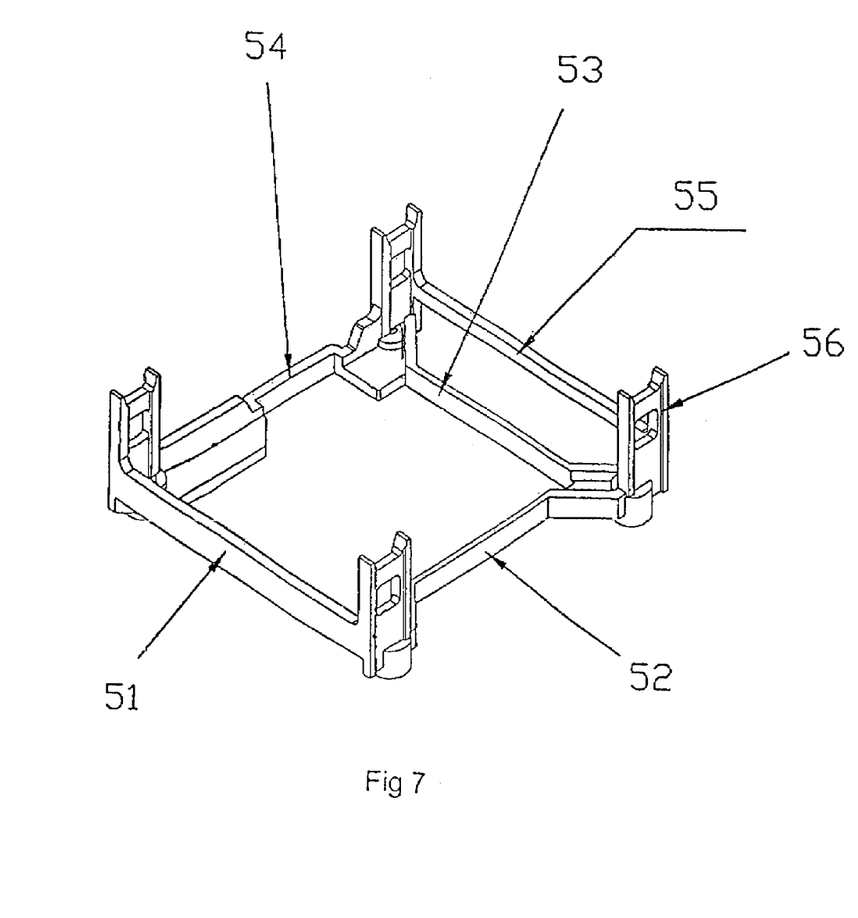
FIG. 7 is a perspective view of the second embodiment of a frame of a heat sink for a CPU in a computer according to the present invention.

Referring to FIG. 7, the second embodiment of a frame of a heat sink for a CPU in a computer according to the present invention is illustrated. The difference of the present embodiment from the first embodiment is in that another reinforcing rib 57 is disposed between inner surfaces of the two stop plates 56 at both ends of the side 51 in parallel to the reinforcing rib 55 and thickness of the reinforcing rib 57 is the same as the vertical side of the stop step 51'. In this way, strength and rigidity of the side 51 increase as well.

Figure 8:
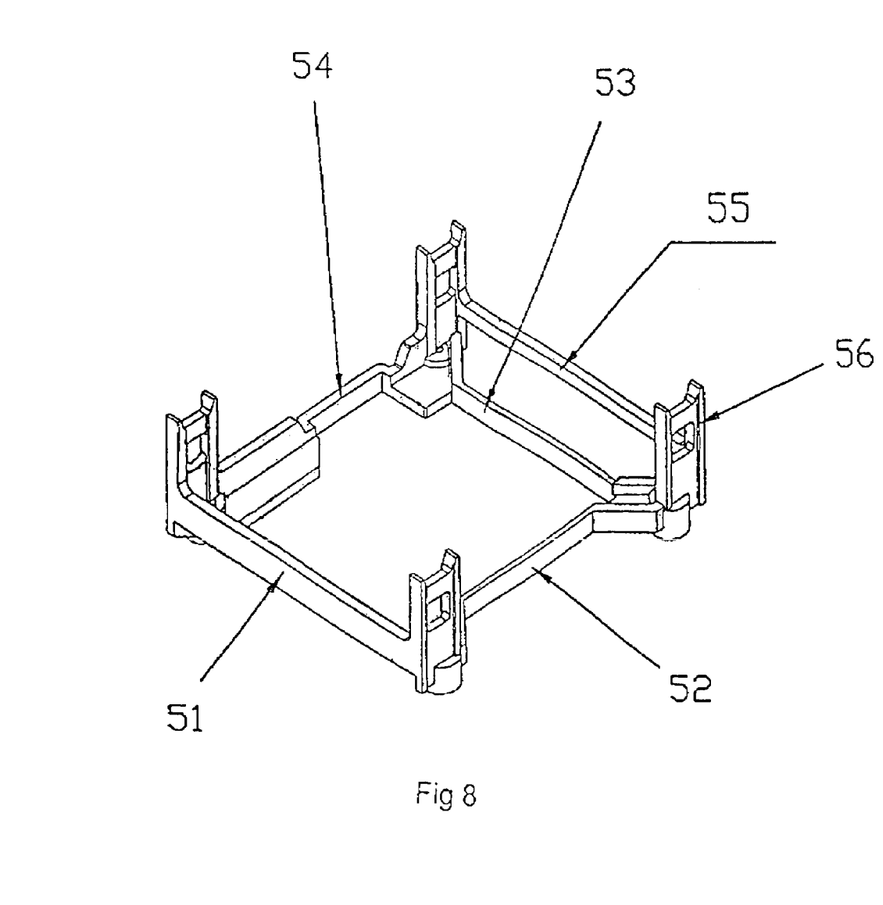
FIG. 8 is a perspective view of the third embodiment of a frame of a heat sink for a CPU in a computer according to the present invention.

Referring to FIG. 8, the third embodiment of a frame of a heat sink for a CPU in a computer according to the present invention is illustrated. The difference of the present embodiment from the second embodiment is in that a reinforcing rib is disposed between inner surfaces of the two stop plates 56 at both ends of a further side 52 at the right side of the side 51 with thickness thereof being the same as the stop plates 56 to increase strength and rigidity of the side 52.

Figure 9:
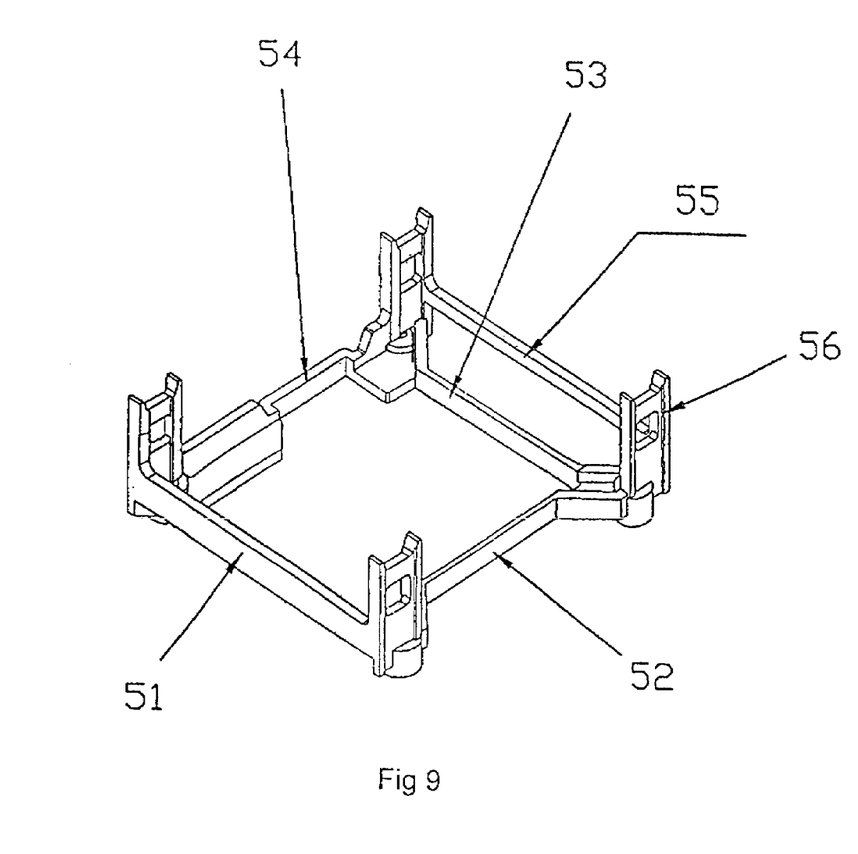
FIG. 9 is a perspective view of the fourth embodiment of a frame of a heat sink for a CPU in a computer according to the present invention.

Referring to FIG. 9, the fourth embodiment of a frame of a heat sink for a CPU in a computer according to the present invention is illustrated. The difference of the present embodiment from the third embodiment is in that a reinforcing rib is disposed between inner surfaces of the two stop plates 56 at both ends of a further side 54 at the left side of the side 51 with thickness thereof being the same as the stop plates 56 to increase strength and rigidity of the side 52.

It is appreciated that a frame of a heat sink for a CPU in a computer according to the present invention has the following advantages:

1. The frame of the present invention provides high strength and rigidity against deformation.

2. The frame of the present invention is capable of restricting movement of the heat sink along direction of the depth thereof in addition to restricting movement of the heat sink along direction of width thereof.

While the invention has been described with referencing to preferred embodiments thereof, it is to be understood that modifications or variations may be easily made without departing from the spirit of this invention, which is defined by the appended claims.

What is claimed is:

1. A frame of a heat sink for a CPU in a computer, comprising:

a quadrilateral frame member, providing a first side and a second side, which is opposite to the first side, the first side having a length being equal to the width of the heat sink and having an opening block step, the block step having the bottom thereof being the same elevation as the top of the second side; and four stop plates, being upright from the four corners of the frame member respectively, being positioned in parallel to each other and two of the stop plates, which are disposed at both ends of the first side, providing an inner surface respectively and a distance between the respective inner surface being equal to the length of the first side;

characterized in that a reinforcing rib is disposed between another two of the stop plates, which are disposed at both ends of the second side, and is parallel to the second side with an elevation higher than the top of the second side and a distance between the inner surface of the reinforcing rib and the block step is equal to the depth of the heat sink.

2. The frame of a heat sink for a CPU in a computer as defined in claim 1, wherein the reinforcing rib is parallel to the first side.

3. The frame of a heat sink for a CPU in a computer as defined in claim 1, wherein another reinforcing rib is disposed between inner surfaces of the two stop plates at both ends of the first side in parallel to the reinforcing rib and thickness of the reinforcing rib is the same as the vertical side of the block step.

4. The frame of a heat sink for a CPU in a computer as defined in claim 1, wherein a further reinforcing rib is disposed between inner surfaces of two of the stop plates at both ends of a third side of the frame member at the right side of the first side with thickness thereof being the same as the stop plates.

5. The frame of a heat sink for a CPU in a computer as defined in claim 1, wherein a further reinforcing rib is disposed between inner surfaces of two of the stop plates at both ends of a fourth side at the left side of the first side with thickness thereof being the same as the stop plates.

* * * * *